(12) United States Patent
Singh

(10) Patent No.: US 9,385,715 B2
(45) Date of Patent: *Jul. 5, 2016

(54) MULTI-THRESHOLD FLASH NCL LOGIC CIRCUITRY WITH FLASH RESET

(71) Applicant: Wave Semiconductor, Inc., Campbell, CA (US)

(72) Inventor: Gajendra Prasad Singh, Sunnyvale, CA (US)

(73) Assignee: Wave Computing, Inc., Campbell, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/703,483

(22) Filed: May 4, 2015

(65) Prior Publication Data

US 2015/0236695 A1    Aug. 20, 2015

Related U.S. Application Data

(63) Continuation of application No. 13/772,759, filed on Feb. 21, 2013, now Pat. No. 9,024,655.

(60) Provisional application No. 61/601,547, filed on Feb. 21, 2012.

(51) Int. Cl.
| | |
|---|---|
| *H03K 19/00* | (2006.01) |
| *H03K 19/094* | (2006.01) |
| *H03K 19/23* | (2006.01) |
| *H03K 23/40* | (2006.01) |
| *H03K 23/58* | (2006.01) |
| *H03K 19/096* | (2006.01) |

(52) U.S. Cl.
CPC .......... *H03K 19/0013* (2013.01); *H03K 19/096* (2013.01); *H03K 19/09425* (2013.01); *H03K 19/23* (2013.01); *H03K 23/40* (2013.01); *H03K 23/58* (2013.01)

(58) Field of Classification Search
CPC .......... H03K 19/0016; H03K 19/0813; H03K 19/094; H03K 19/09425; H03K 19/0963; H03K 19/0027; H03K 19/0013; H03K 19/096; H03K 19/23; H03K 2217/94026; H03K 23/40; H03K 23/58; G06F 1/3203; G06F 1/3296; Y02B 60/1285

See application file for complete search history.

(56) References Cited

U.S. PATENT DOCUMENTS

| | | |
|---|---|---|
| 5,305,463 A | 4/1994 | Fant et al. |
| 5,355,496 A | 10/1994 | Fant et al. |
| 5,572,732 A | 11/1996 | Fant et al. |
| 5,640,105 A | 6/1997 | Sobelman et al. |
| 5,652,902 A | 7/1997 | Fant |

(Continued)

OTHER PUBLICATIONS

"Glitch-Free Design for Multi-Threshold CMOS NCL Circuits", by Al Zahrani, et al., GLIVLSI'09, May 10-12, 2009, Boston, Massachusetts, Copyright 2009 ACM 978-1-60558-522-Feb. 9, 2005.

*Primary Examiner* — Vibol Tan
(74) *Attorney, Agent, or Firm* — Adams Intellex, PLC

(57) ABSTRACT

Multi-threshold flash Null Convention Logic (NCL) includes one or more high threshold voltage transistors within a flash NCL gate to reduce power consumption due to current leakage by transistors of the NCL gate. High-threshold voltage transistors may be added and/or may be used in place of one or more lower voltage threshold transistors of the NCL gate. A high-Vt device is included in the pull-up path to reduce power when the flash NCL logic gate is in the null state.

17 Claims, 8 Drawing Sheets

(56) References Cited

U.S. PATENT DOCUMENTS

| | | |
|---|---|---|
| 5,656,948 A | 8/1997 | Sobelman et al. |
| 5,664,211 A | 9/1997 | Sobelman et al. |
| 5,664,212 A | 9/1997 | Fant et al. |
| 5,764,081 A | 6/1998 | Fant et al. |
| 5,793,662 A | 8/1998 | Duncan et al. |
| 5,796,962 A | 8/1998 | Fant et al. |
| 5,805,461 A | 9/1998 | Fant et al. |
| 5,828,228 A | 10/1998 | Fant et al. |
| 5,896,541 A | 4/1999 | Fant et al. |
| 5,907,693 A | 5/1999 | Fant et al. |
| 5,930,522 A | 7/1999 | Fant |
| 5,977,663 A | 11/1999 | Fant et al. |
| 5,986,466 A | 11/1999 | Sobelman et al. |
| 6,020,754 A | 2/2000 | Sobelman et al. |
| 6,031,390 A | 2/2000 | Fant et al. |
| 6,043,674 A | 3/2000 | Sobelman |
| 6,052,770 A | 4/2000 | Fant |
| 6,128,678 A | 10/2000 | Masteller |
| 6,262,593 B1 | 7/2001 | Sobelman et al. |
| 6,275,841 B1 | 8/2001 | Potter et al. |
| 6,308,229 B1 | 10/2001 | Masteller |
| 6,313,660 B1 | 11/2001 | Sobelman et al. |
| 6,327,607 B1 | 12/2001 | Fant |
| 6,333,640 B1 | 12/2001 | Fant et al. |
| 6,433,584 B1 | 8/2002 | Hatae |
| 6,526,542 B2 | 2/2003 | Kondratyev |
| 6,900,658 B1 | 5/2005 | Sobelman et al. |
| 6,900,666 B2 * | 5/2005 | Kursun ............. H03K 19/0013 326/121 |
| 7,053,662 B1 | 5/2006 | Silver et al. |
| 7,478,222 B2 | 1/2009 | Fant |
| 7,930,517 B2 | 4/2011 | Fant |
| 7,977,972 B2 | 7/2011 | Di et al. |
| 8,020,145 B2 | 9/2011 | Fant |
| 8,026,741 B2 | 9/2011 | Takayanagi |
| 8,078,839 B2 | 12/2011 | Fant |
| 8,086,975 B2 | 12/2011 | Shiring et al. |
| 2006/0233006 A1 | 10/2006 | Fant |
| 2009/0204788 A1 | 8/2009 | Fant |

* cited by examiner

MULTI-THRESHOLD FLASH NCL LOGIC CIRCUITRY WITH FLASH RESET

RELATED APPLICATIONS

This application is also a continuation-in-part of U.S. patent application "Multi-Threshold Flash NCL Circuitry" Ser. No. 13/772,759, filed Feb. 21, 2013 which claims the benefit of U.S. provisional patent application "Multi-Threshold Flash NCL Circuitry" Ser. No. 61/601,547, filed Feb. 21, 2012. The foregoing application is hereby incorporated by reference in its entirety.

FIELD OF ART

This application relates generally to logic circuitry and more particularly to flash null convention logic with multiple different threshold voltage transistors.

BACKGROUND

Advances in integrated circuit manufacturing technologies make possible electronic systems comprising tens or even hundreds of millions of active devices. In addition, increased numbers of interconnection layers provide for more signal wiring and more complex control schemes. Among other things, the demand for such systems has led to increased system performance, decreased device size, and greater feature sets. The direct result of system and technology improvements is ever increasing design complexity. The design complexity drives engineering challenges with regard to circuit design, system implementation and control, chip fabrication, and the like. This complexity has, for example, driven greater scrutiny of the logic circuits, interconnection schemes, systems architectures, and controls. As a result, new technologies, architectures, and circuit families have been developed which can take advantage of the reduced total device count, smaller device sizes, and simplified wiring/control schemes. These circuit families each provide certain benefits and costs, each requiring its own careful design considerations.

Logic circuits fall into two broad categories, static circuits and dynamic circuits. Static circuits find many applications where signal integrity and system robustness are paramount design criteria. In contrast, dynamic circuits find many applications where system performance and circuit density are paramount. Personal computer memories and microprocessors are typical examples of circuits that demand high circuit density with high system performance. Interest has been focused on circuit families that can drastically reduce the amount of clock and control signal interconnect required to support them. For example, circuit families that do not require a clock signal, such as asynchronous or self-timed circuits, have distinct advantages over their clocked counterparts because the need for external control signals is reduced or eliminated. Further, circuit families that can provide for the local generation of required control signals may further reduce wiring and control complexity.

SUMMARY

Multi-threshold flash Null Convention Logic (NCL) includes one or more high voltage threshold transistors within an NCL gate to reduce power consumption due to current leakage in the lower voltage threshold transistors of the NCL gate. Depending on the embodiment, the high voltage threshold transistors may be added transistors and/or may be used in place of one or more lower voltage threshold transistors of the NCL gate. A logic circuit is disclosed comprising: a gate comprised of a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and a high-threshold transistor in a pull-up path that is used to reset the gate and set the output line into the null output state. The plurality of transistors that provide for logical evaluation may pull down a node within the gate and cause the output line to transition to the asserted output state. The high-threshold transistor in the pull-up path may limit current leakage for the gate when in an off state. The circuit may further comprise at least a second high-threshold transistor. The second high-threshold transistor may turn off a pull-down path when the gate is being reset. The plurality of transistors that provide for logical evaluation may be part of the pull-down path. The plurality of transistors that provide for logical evaluation may include low-threshold transistors.

The second high-threshold transistor may be in a pull-up path for an output inverter and is gated based on the flash input line to the gate. The second high-threshold transistor may be in a pull-down path for an output inverter. The second high-threshold transistor may have its gate attached to a logical evaluation node within the gate. The circuit may further comprise a one-shot circuit wherein the flash input line is an input to the one-shot circuit and wherein the one-shot circuit resets the gate which sets the output line in the null output state. The gate may comprise an m-of-n threshold gate. The gate may form a null convention circuit. The gate may comprise a flash-type circuit.

In embodiments, a computer implemented method for using logical evaluation may comprise: forming a logic gate from a plurality of transistors wherein the plurality of transistors provide for logical evaluation; including a plurality of input lines, each having an asserted state and a null state, connected to the gate; providing a flash input line, having a first state and a second state, connected to the gate; observing an output line, having an asserted output state and a null output state, connected to the gate; and including a high-threshold transistor in a pull-up path that is used to reset the gate and set the output line into the null output state. The logic gate may further comprise a second high-threshold transistor in a pull-down path. The logic gate may further comprise a third high-threshold transistor in a pull-up path for an output inverter wherein the third high-threshold transistor is gated based on the flash input line to the gate. The logic gate may further comprise a fourth high-threshold transistor in a pull-down path for an output inverter. The logic gate may further comprise a one-shot circuit wherein the flash input line is an input to the one-shot circuit and wherein the one-shot circuit resets the gate which sets the output line in the null output state. In embodiments, a m-of-n flash-type threshold gate may comprise: a plurality of transistors wherein the plurality of transistors provide for logical evaluation; a plurality of n input lines, each having an asserted state and a null state, connected to the gate; a flash input line, having a first state and a second state, connected to the gate; an output line, having an asserted output state and a null output state, connected to the gate, wherein the output line transitions to the asserted output state when m of the n input lines are in their respective asserted states; and a high-threshold transistor in a pull-up path that is used to reset the gate and set the output line into the null output state. The m-of-n flash-type threshold gate may further comprise a one-shot circuit wherein the flash input line is an input to the one-shot circuit and wherein the one-shot circuit resets the gate which sets the output line in the null output state. In some embodiments, an m-of-n threshold circuit may comprise: a plurality of transistors wherein the plurality of transistors provide for logical evaluation; a plurality of n input lines, each having an asserted state and a null state, connected to the circuit; an output line, having an asserted output state and a null output state, connected to the circuit, wherein the output line transitions to the asserted output state when m of the n input lines are in their respective asserted states; and a high-threshold transistor in a pull-up path that is used to reset the circuit and set the output line into the null output state.

In embodiments, a computer implemented method for using logic implementation may comprise: including a multi-threshold flash null convention logic gate wherein the multi-threshold flash null convention logic gate comprises: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and a high-threshold transistor in a pull-up path that is used to reset the gate and set the output line into the null output state; connecting the multi-threshold flash null convention logic gate to preceding and following logic; and connecting the flash input line to a flash null generation circuit. In some embodiments, a computer program product embodied in a non-transitory computer readable medium for logic implementation may comprise: code for including a multi-threshold flash null convention logic gate wherein the multi-threshold flash null convention logic gate comprises: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; a high-threshold transistor in a pull-up path that is used to reset the gate and set the output line into the null output state; code for connecting the multi-threshold flash null convention logic gate to preceding and following logic; and code for connecting the flash input line to a flash null generation circuit. In embodiments, a computer system for logic implementation may comprise: a memory which stores instructions; one or more processors attached to the memory wherein the one or more processors are configured to: include a multi-threshold flash null convention logic gate wherein the multi-threshold flash null convention logic gate comprises: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; a high-threshold transistor in a pull-up path that is used to reset the gate and set the output line into the null output state; connecting the multi-threshold flash null convention logic gate to preceding and following logic; and connecting the flash input line to the multi-threshold flash null convention logic gate.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
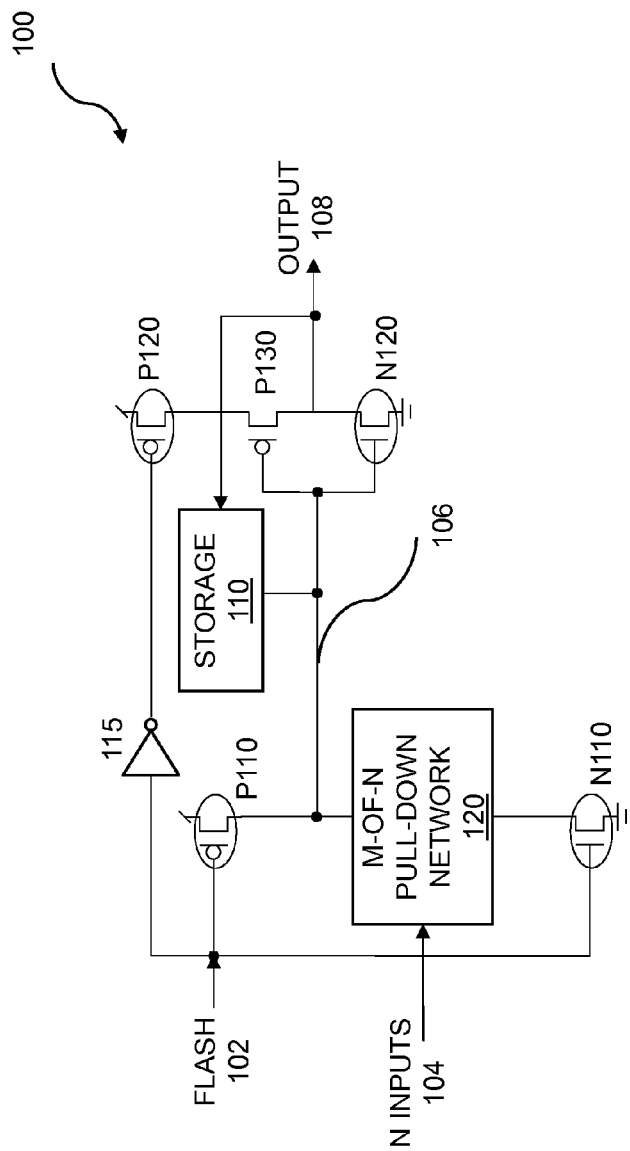
FIG. 1 is a circuit diagram of flash Null Convention Logic (NCL) with multi-threshold FETs.

The present disclosure provides a description of various methods and apparatus for multi-threshold flash Null Convention Logic (NCL) circuits. A multi-threshold flash NCL circuit enables significant power savings and performance improvement over previous circuit technologies. NCL provides for asynchronous logic techniques which prevent power being expended by eliminating the clocking of circuitry. Asynchronous logic spends a significant portion of the time waiting for data to arrive or change state. With flash NCL logic, circuitry is frequently in the null state. The selective use of high-threshold voltage transistors can radically reduce the power consumption during the null state while maintaining high performance speeds during transitions to active states.

Flash NCL circuits are a class of asynchronous circuits described in U.S. Pat. No. 6,043,674 entitled "Null Convention Logic Gates with Flash, Set and Reset Capability," which is incorporated herein by reference in its entirety. Flash NCL may use logic gates, referred to as threshold gates, with varying numbers of inputs and threshold values where a threshold value is defined as a number of inputs being in an "on" state simultaneously. An important aspect of NCL circuits is that any particular input line may have a meaningful value or a null value. Thus NCL circuitry has three possible states: a one value, a zero value, and a null value. The presence of a non-null value indicates that the value has meaning Therefore no external clock is required to indicate that evaluation is possible.

Null convention logic circuitry has numerous implementations. In one implementation, two physical lines may be used to convey an input line's state. For example, a "zero" or logic "false" may be determined by a low voltage being present on the first physical line and a high voltage being present on the second physical line. A "one" or logic "true" may be determined by a high voltage being present on the first physical line and a low voltage being present on the second physical line. A null state may be determined by low voltage levels being present on both physical lines. A high voltage level being present on both physical lines would be considered undefined and would not be used. Other embodiments of NCL logic may utilize multiple different voltages on a single line to indicate null and asserted states, such as a system that may use ground to indicate a null state, a positive voltage for a true state, and a negative voltage for a false state.

Multi-threshold flash Null Convention Logic (NCL) includes one or more high-threshold voltage transistors (High Vt) within the NCL gate to reduce power consumption due to current leakage in the lower voltage threshold transistors of the NCL gate. Because the NCL gate may be built using high-speed transistors, the leakage current of the transistors may be significant even when the circuit is quiescent. By including at least one high-Vt device having low leakage current in the current path, the leakage current of the NCL gate may be significantly reduced, thereby reducing the power consumption of the NCL gate. In some embodiments, the high-Vt transistors (also known as devices) may be added to the basic NCL gate structure, and/or high-Vt transistors may be used in place of one or more lower voltage threshold transistors of the basic NCL gate structure in various embodiments. Field-effect transistors (FETs) are "on" in the linear and saturated regions of operation when they intend to conduct current. During the "off" state for the FET, a transistor exhibits current consumption which is characterized by sub-threshold leakage current. The gate input voltage is below a threshold voltage for the transistor in this state. Normally an N-type metal-oxide semiconductor (NMOS) field-effect transistor, also referred to as an NFET, has its gate at zero volts (ground) when in the off state while the source of the NFET is also at ground. Normally a P-type metal-oxide semiconductor (PMOS) field-effect transistor, also referred to as a PFET, has its gate at the supply voltage (Vdd) when in the off state while the source of the PFET is also at Vdd. Under these conditions the FET exhibits sub-threshold leakage. By using a higher-threshold FET device, current in the sub-threshold voltage regime is radically reduced.

FIG. 1 is a circuit diagram of flash Null Convention Logic (NCL) with multi-threshold field-effect transistors (FETs). The NCL circuit comprises a logic gate 100 including a plurality of transistors. The plurality of transistors provide for logical evaluation such as the logical evaluation of a threshold gate, as shown. An m-of-n threshold gate asserts an output line 108 if a predetermined number 'm' of the 'n' input lines 104 are asserted. In the embodiment shown, the logical evaluation is performed by the m-of-n pull-down network 120, which may be implemented using one or more transistors having low or standard voltage thresholds, which may have higher leakage current than the high-Vt transistors. Thus, the logic gate 100 has a plurality of N input lines 104, each having an asserted state and a null state, connected to the logic gate 100; and an output line 108, having an asserted output state and a null output state, is also connected to the gate.

Flash NCL circuitry includes a flash input line 102, having a first state and a second state, connected to the logic gate 100. If the flash input line 102 is driven low, turning on high-Vt P110 and turning off transistor N110 (if it is included), logical evaluation node 106 is pulled high. Transistor N110 may be a standard transistor or a high-Vt transistor, depending on the embodiment, or may be not be included in some embodiments. In these schematics, a high-Vt transistor is denoted by a circle around the FET. Pulling logical evaluation node 106 high turns transistor N120 on while turning off transistor P120, to pull the output line 108 low, which is the null state. This may be thought of as resetting the gate to a null state. Thus, multi-threshold flash Null Convention Logic (NCL) may include a high-threshold voltage transistor (HTV or high Vt) P110 in a pull-up path that is used to reset the logic gate 100 and set the output line 108 into the null output state. The amount of current that may flow through the transistors in the m-of-n pull-down network 120 in the null state is limited by the lowest leakage current of the transistors in the current path. Because the high-Vt P110 is in the pull-up path, and the high-Vt P110 may have lower leakage current than the standard transistors of the m-of-n pull-down network 120, the high-threshold transistor P110 in the pull-up path limits current leakage for the gate when in the off state.

In some embodiments, the source of PFET P130 may be directly attached to the supply voltage and PFET P120 may not be present. In other embodiments, transistor P120 may be included and thereby gate the output inverter formed by PFET P130 and NFET N120. PFET P120 may be a standard transistor or a high-Vt transistor. In such embodiments, if the flash input line 102 is low, an inverter 115 drives the gate of transistor P120 high, turning transistor P120 off, so that there is very little, if any, current available at the source of transistor P130. Once the flash input line 102 is driven high, turning off high-Vt P110 and turning on transistors P120 and N110, the m-of-n pull-down network 120 is able to perform its logical evaluation function, as the plurality of transistors that provide for logical evaluation are part of the pull-down path. As long as fewer than 'm' of the 'n' inputs 104 are asserted, the network 120 is in a high-impedance state so that the logical evaluation node 106 remains high and the output line 108 is low, or null. Because transistor N110 is on, once at least 'm' of the 'n' inputs 104 are asserted turning on the network 120 and pulling logical evaluation node 106 low, an output inverter formed by transistor P130 and transistor N120 causes the output line 108 to assert, or drive high.

In some embodiments, the storage 110 provides feedback from the output 108 to logical evaluation node 106. The storage 110 may be an inverter in some embodiments, although it may simply be a PFET transistor to pull the logic evaluation node 106 high. When a single PFET is used it is sometimes referred to as a half latch. In alternate embodiments, other circuitry may be used in the storage 110 block. In some embodiments, the transistors used in the storage 110 may be smaller, with limited current capability and/or have higher on-state resistance than the transistors used in other parts of the logic gate 100. The devices may be also be high-Vt or have a standard voltage threshold. Once the logic gate 100 has been reset by driving the flash input line 102 low, then back high, storage 110 may help keep the logical evaluation node 106 high until it is pulled low by the m-of-n pull-down network 120. The storage 110 may also provide a latching effect in the case where at least 'm' of the 'n' inputs 104 are asserted for some period of time, causing the output line 108 to be asserted, until one or more of the inputs goes back to the null state, putting the m-of-n pull-down network 120 back into a high impedance state. In this situation, the storage 110 maintains the logical evaluation node 106 at a low until the flash input line 102 is driven low again.

It should be noted that there are varying ways of drawing schematic symbols for transistors throughout the industry. The actual threshold voltages and leakage currents of the high-Vt transistors and standard transistors may vary dramatically depending on the technology used, with the voltage threshold of a standard transistor ranging from several volts for some technologies to only millivolts (mV) in other technologies. The different parameters to change voltage threshold and/or leakage current for a transistor are well-known in the art but may include thicker gate oxides, a different channel dopant density, different channel and/or gate geometry, or other differences in the way that the transistors are fabricated. For the purposes of this disclosure, the terms "low-leakage transistor," "high voltage threshold transistor," "high-Vt transistor," "and high-threshold transistor" may be thought of as synonyms and may be used interchangeably.

At least a second high-threshold transistor may be included in the NCL logic gate 100 in some embodiments. One example of an additional high-Vt transistor is N110, where the second high-threshold transistor turns off the pull-down path when the logic gate 100 is being reset. Another example is high-Vt transistor N120, where the second high-threshold transistor is in a pull-down path for the output inverter and the second high-threshold transistor has its gate attached to a logical evaluation node 106 within the logic gate 100.

In some embodiments, the second high-threshold transistor is in a pull-up path for the output inverter and is gated based on the flash input line 102 to the gate, such as high-Vt transistor P120. The gate of high-Vt transistor P120 may be driven by a line derived from the flash input line 102, such as the output of the inverter 115. Other embodiments may use other circuitry between the flash input line 102 and the gate of the high-Vt transistor P120, and depending on the specifics of implementation and the type of high-Vt transistor used, the flash input line 102 may directly drive the high-Vt transistor.

Various embodiments may include one, two, three, four or more high-Vt transistors in an NCL gate in addition to the standard transistors of the logic evaluation circuitry. Some embodiments may have a single high-Vt transistor in a pull-up path to reset the gate. Other embodiments may add a second high-Vt transistor. The second high-Vt transistor may replace a standard transistor, such as transistor N120, or the second high-Vt transistor may be added to the basic circuit structure, such as transistor P120 or transistor N110. Yet other embodiments may have three high-Vt transistors such as high-Vt transistor P110, high-Vt transistor N110, and high-Vt transistor N120; high-Vt transistor P110, high-Vt transistor N110, and high-Vt transistor P120; high-Vt transistor P110, high-Vt transistor N120, and high-Vt transistor P120; or high-Vt transistor P110 and any other two high-Vt transistors, including using high-Vt transistors in the logic gate 100 in ways that are not shown in FIG. 1. Other embodiments may have four or more high-Vt transistors, including high-Vt transistor P110 and any combination of three or more other high-Vt transistors.

Figure 2:
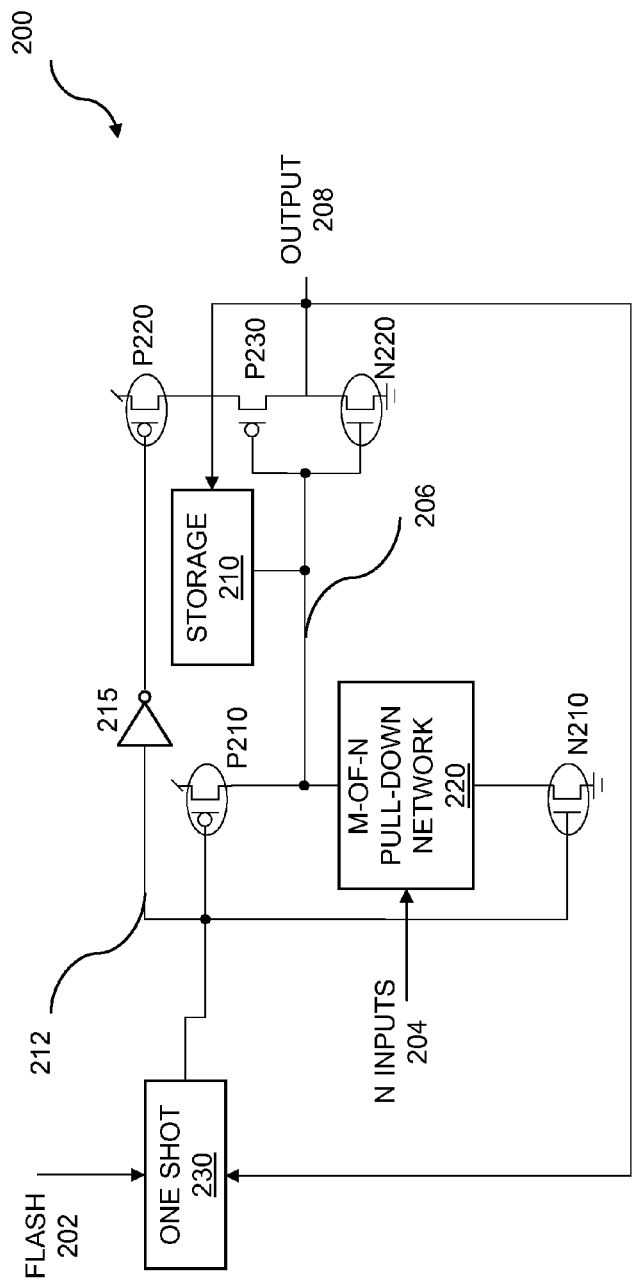
FIG. 2 is a circuit diagram of multi-threshold flash NCL with one-shot.

FIG. 2 is a circuit diagram of multi-threshold flash NCL with a one-shot. The logic gate 200 is similar to the logic gate 100 of FIG. 1, with a m-of-n pull-down network 220 having 'N' input lines 204 that may pull-down logic evaluation node 206 if at least 'm' of 'n' inputs are asserted. The logic evaluation node 206 may be connected to an output inverter made up of pull-up transistor P230 and pull-down transistor N220, which together drive the output line 208. Storage block 210 may be used to feedback an inverted value of the output line 208 to help hold the output line 208 at the proper state. Internal reset node 212, which is similar to the flash line 102 of FIG. 1, is coupled to the gate of the high-Vt transistor P210 that may be used to reset the logic gate 200. Internal reset node 212 may also be coupled to transistor N210 that may provide a virtual ground for the m-of-n pull-down network 220 if the internal reset node 212 is high. The gate of transistor P220 may be driven by a line derived from the internal reset node 212, such as the output of the inverter 215.

Various embodiments, such as the embodiment of m-of-n threshold logic gate 200, may include a one-shot circuit 230 where the flash input line 202 is an input to the one-shot circuit 230. The one-shot circuit 230 may have an output that is coupled to the internal reset node 212 so that if the one-shot circuit 230 is triggered by a transition of the flash input line 202, the output of the one-shot circuit 230 resets the gate, which sets the output line 208 in the null output state. In this example, logic gate 200, the output 208 is reset low. In some embodiments, the one-shot circuit 230 may generate a self-timed pulse in response to a transition of the flash input line 202 using a string of buffers and/or inverters. One embodiment of the one-shot circuit 230 is a NAND gate with the flash input 202 driving the input of the NAND gate as well as an odd number of inverters. The output of the odd number of inverters is a second input to the NAND gate. The output of the NAND gate would, in this case, provide a low pulse for internal reset node 212 based on the flash node 202 transitioning high. The timing duration of the low pulse for the internal reset node 212 would be based on the number of inverters used. Other embodiments may drive the output of the one-shot circuit 230 low in response to the transition of the flash input line 202 high and hold it low until the gate's output line 208 is driven to the null state, indicating that the logic gate 200 has been reset. Such a circuit may be implemented as an asynchronous state machine or with combinatorial logic such as a NAND gate with the flash input line 202 as one input and the output line 208 as the other input, as long as the input lines 204 are null before the flash input line is asserted. It will be noted that, in this embodiment of the one-shot circuit 230 where the output 208 is fed back into a NAND gate, the internal reset node 212 only pulses low if the output 208 was previously in a high state. That means that if the output was not high, there was no wasted power pulsing the internal reset node 212 unnecessarily.

Figure 3:
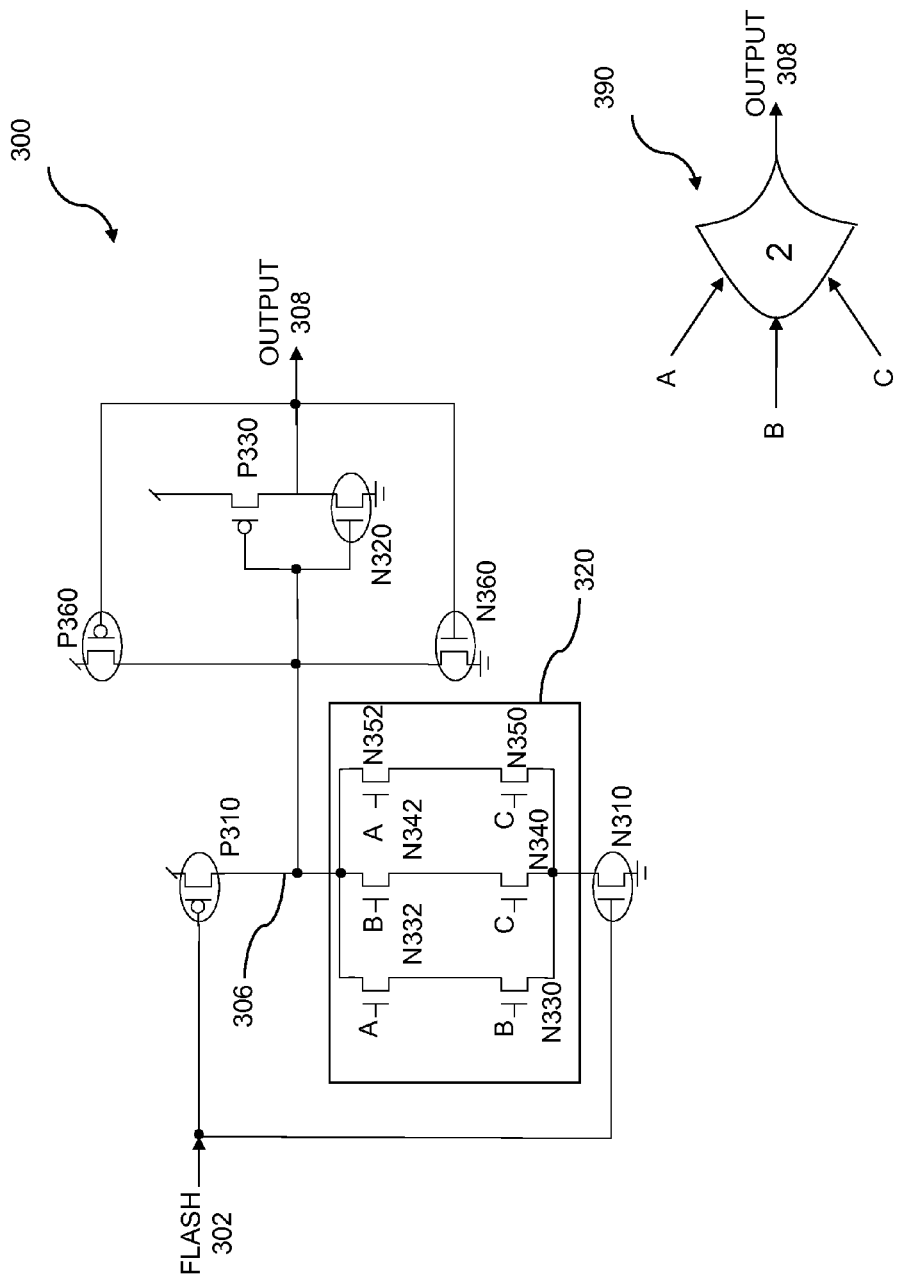
FIG. 3 is a circuit diagram of an example 2-of-3 multi-threshold flash NCL gate.

FIG. 3 is a circuit diagram of an example 2-of-3 multi-threshold flash NCL logic gate 300. An alternative schematic representation of the gate 300 is the gate symbol 390 with three inputs, "A," "B," and "C;" the numeral "2" inside the gate symbol; and a single output 308. The logic gate 300 has a flash input line 302 that may be driven low to reset the logic gate 300 to a null state. If the flash input line 302 is driven low, high-Vt transistor P310 is turned on and high-Vt transistor N310 is turned off, driving logical evaluation node 306 high. The logical evaluation node 306 is coupled to the output inverter, made up of transistor P330 and high-Vt transistor N320, which drives the output line 308 low, or null. Once the output line 308 has been driven to null, that value is fed back to the logical evaluation node 306 by the inverter made up of high-Vt transistor P360 and high-Vt transistor N360 to help hold the value of the logical evaluation node 306. PFET P360 and NFET N360 may be smaller devices that adequately hold evaluation node 306 but which are easily overdriven by PFET P310 or the m-of-n network 320.

Once the flash input line 302 goes high, turning off high-Vt transistor P310 and turning on high-Vt transistor N310 to provide a virtual ground to the logical evaluation circuit 320, logical evaluation node 306 may be pulled low as soon as at least two of the three inputs are asserted. The logical evaluation circuit 320 implements three AND circuits wired in an OR configuration to implement the Boolean expression A·B+B·C+A·C. The first AND implementation of A·B includes transistors N330 and N332 in series. The second AND implementation of BC includes transistors N340 and N342 in series. The third AND implementation A·C includes transistors N350 and N352 in series. Thus, gate 300 is an m-of-n flash-type threshold null convention logic gate, with a 2-of-3 threshold and a plurality of transistors to provide for logical evaluation. The logic gate 300 has a plurality of n input lines—in this case the three input lines A, B, and C—each having an asserted state and a null state, connected to the gate 300; a flash input line 302, with a first state and a second state, connected to the gate 300; and an output line 308, with an asserted output state and a null output state, connected to the gate. The plurality of transistors that provide for logical evaluation pull down a node within the gate and cause the output line to transition to the asserted output state. The output transitions to the asserted output state when m-of-n input lines—in this embodiment, two of the three input lines—are in their respective asserted states.

In many embodiments, the transistors used to implement the AND functions may be high speed transistors (transistors with low voltage thresholds which may have higher leakage current than a high-Vt transistor). But, note that the logic gate 300 may include five high-Vt transistors and has at least one high-Vt transistor in the current path from power to ground in both the null and asserted states, including a high-threshold transistor P310 in a pull-up path that is used to reset the logic gate 300 and set the output line 308 into the null output state. This may help reduce power consumption when compared to a logic gate built entirely from low-Vt or standard transistors. The logic gate 300 may comprise a flash type circuit.

Figure 4:
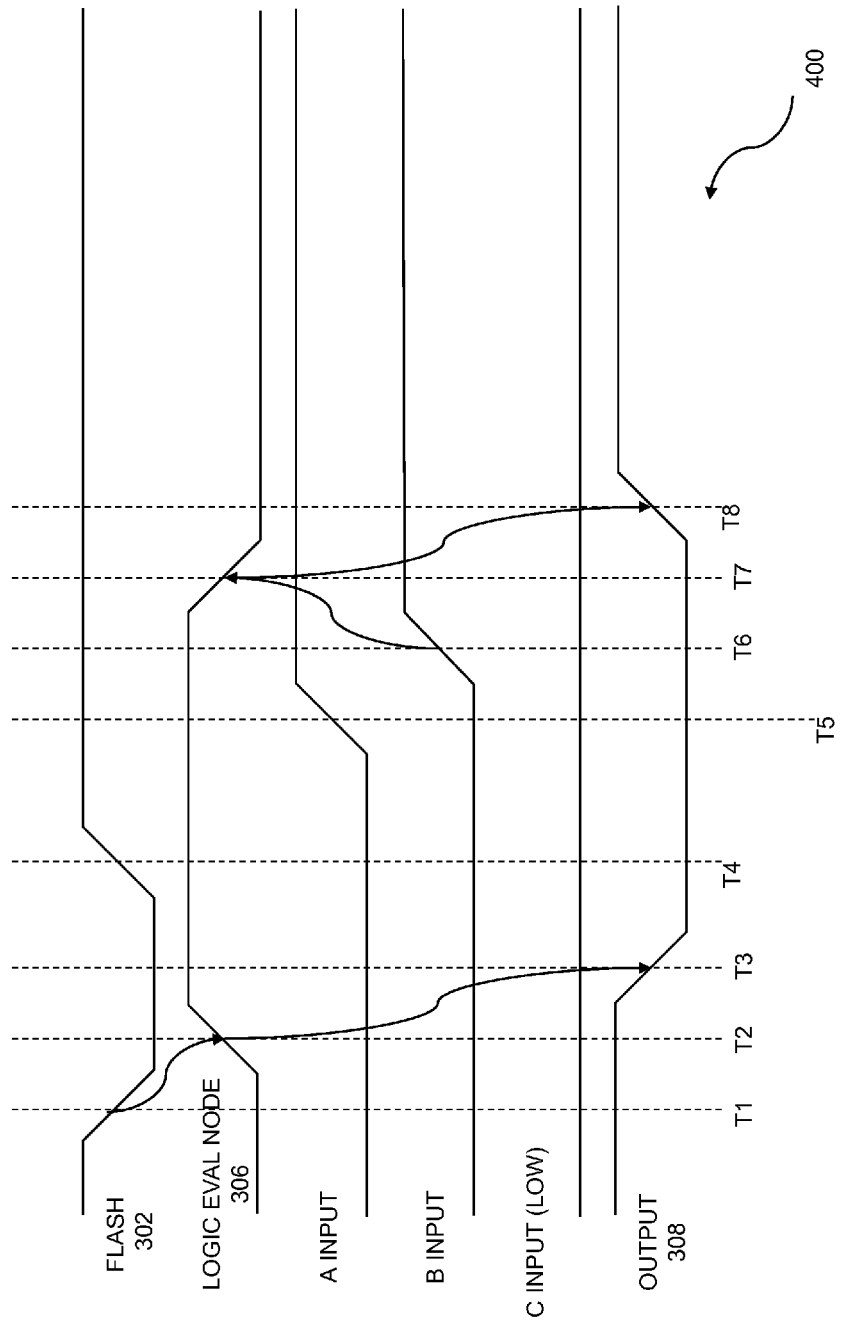
FIG. 4 is an example waveform diagram for a 2-of-3 flash NCL circuit.

FIG. 4 is an example waveform diagram 400 for the NCL logic gate 300. The logic gate 300 of FIG. 3 has its output line 308 asserted at time T1 as the flash line 302 is driven low. The transition of the flash line 302 from high to low causes the logic evaluation node 306 to transition high at time T2. The logical evaluation node 306 is inverted so the output line 308 goes to a null state at time T3. At some time before T1, the inputs A, B, and C all became low. One, two, or three of these inputs A, B, and C may have transitioned in a previous evaluation. One, two, or three of these inputs A, B, and C may have transitioned low recently before T1. It should be noted that these inputs A, B, and C do not need to transition together.

The flash input 302 returns high at T4 before the logic gate 300 is ready for further input data to arrive. In this example, input A goes high at some time T5 and input B goes high at some time T6. Since the logic gate 300 includes a 2-of-3 network and since two of the inputs (A and B) have gone high, the logic evaluation node 306 is pulled low at time T7. Based on the logic evaluation node pulling low, the output 308 is asserted and pulled high at time T8. So the plurality of transistors that provide for logical evaluation pull down a node within the gate and cause the output line 308 to transition to the asserted output state.

The time delays between times T1 and T2 and also between T2 and T3 are dependent on the speed of the various transistors of the logic gate 300 as well as the capacitance and resistance of the various circuit elements. The timing of times T4, T5, and T6 are determined outside of the logic gate 300 by the circuits driving flash input 302, input A, and input B. The time delay between times T6 and T7 and also between T7 and T8 are again dependent on the speed of the various transistors of the logic gate 300 as well as the capacitance and resistance of the various circuit elements.

Figure 5:
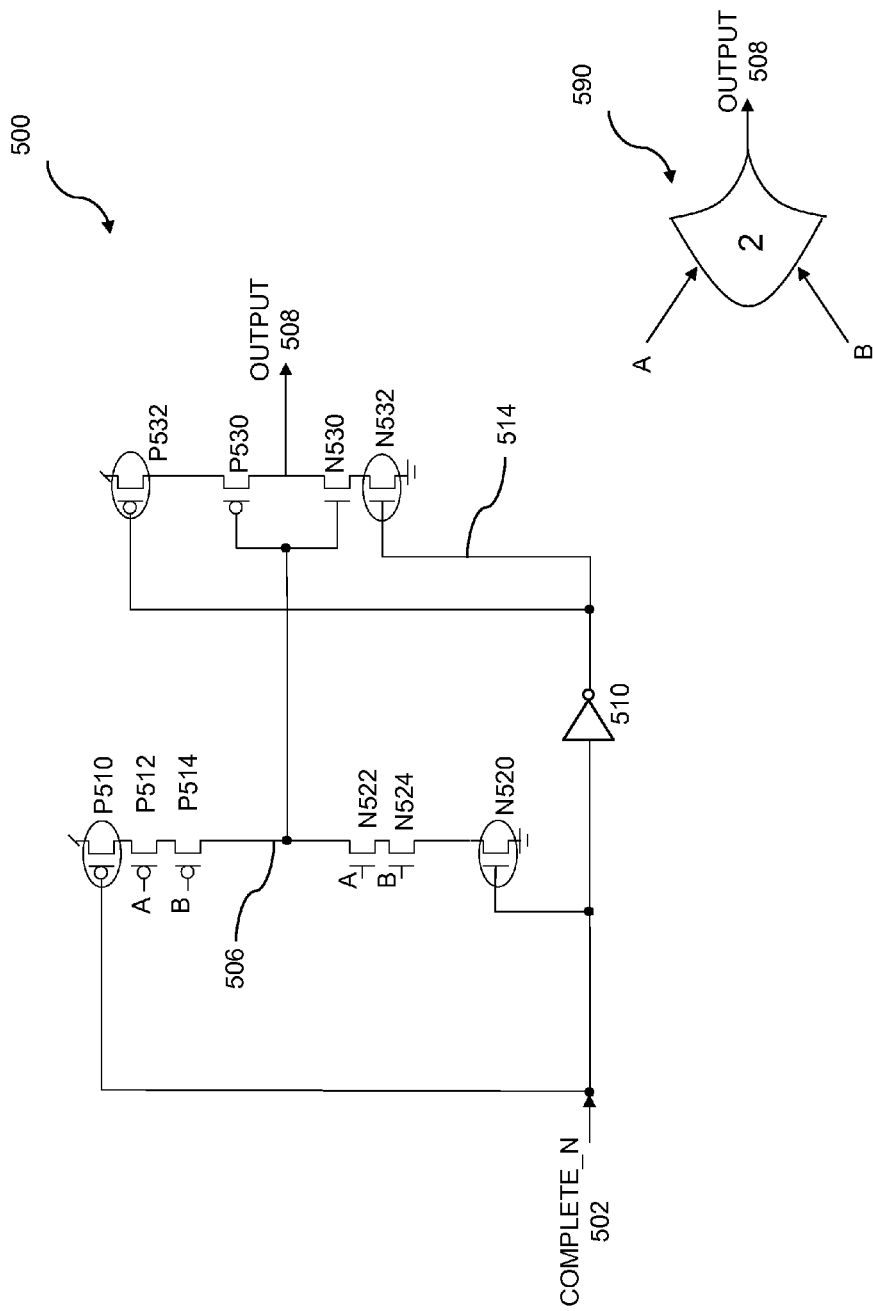
FIG. 5 is a circuit diagram of an example static 2-of-2 multi-threshold NCL gate.

FIG. 5 is a circuit diagram of an example static 2-of-2 multi-threshold NCL circuit 500 which is a type of m-of-n threshold circuit. An alternative schematic representation of the circuit 500 is the logic gate symbol 590 with two inputs, "A" and "B," the numeral "2" inside the gate symbol, and a single output 508. The circuit 500 is a static NCL gate with no flash input line. The circuit 500 includes a plurality of transistors, P512, P514, N522, and N524, to provide for logical evaluation, and a plurality of n input lines (n=2 for the embodiment of FIG. 5), each having an asserted state and a null state, connected to the circuit. The circuit 500 also includes an output line 508, with an asserted output state and a null output state, connected to the circuit 500 wherein the output line 508 transitions to the asserted output state when m of the n input lines are in their respective asserted states.

The circuit 500 has a complete_n line 502 that may be driven high to allow the circuit 500 to propagate assertions, and driven low to propagate nulls. If the complete_n line 502 is driven high after gate 500 is in the null state, high-Vt transistor P510 is turned off, high-Vt transistor N520 is turned on, and inverter 510 drives output control node 514 low, turning on high-Vt transistor P532 and turning off high-Vt transistor N532. This allows the plurality of transistors to logically evaluate whether the 2-of-2 criteria for the input has been met to propagate assertions. Specifically, in the embodiment shown, transistor N522 is turned on if A is asserted and transistor N524 is on if B is asserted. So if and only if both A and B are asserted, logical evaluation node 506 is pulled to the virtual ground node provided by high-Vt transistor N520. Once logical evaluation node 506 is low, the output inverter made up of transistor N530 and transistor P530 couples the output line 508 to the virtual power node provided by high-Vt transistor P532 to assert the output line 508.

At some point, the complete_n line 502 may be driven low to allow nulls to propagate through the circuit 500. If the complete_n line 502 is low, high-Vt transistor P510 is on, high-Vt transistor N520 is off, and inverter 510 is driving output control node 514 high, turning off high-Vt P532 and turning on high-Vt transistor N532. This allows the plurality of transistors to logically evaluate the inputs A and B to determine if both are null. This function is implemented in circuit 500 by transistor P512 which is turned on if A is null and transistor P514 which is turned on if B is null. So if and only if both A and B are null, logical evaluation node 506 is pulled to the virtual power provided by high-Vt P510, which causes the output inverter made up of transistor P530 and transistor N530 to drive the output line 508 low to represent the null state. Since putting the circuit 500 into the null state may be thought of as a reset, the circuit 500 includes a high-threshold transistor P510 in a pull-up path that is used to reset the circuit 500 and set the output line 508 into the null output state. Although the circuit 500 includes four high-Vt transistor devices, other embodiments may have one, two, three, four or more high-Vt transistor devices, or may have high-Vt transistor devices that are different than the devices shown in FIG. 5. It will be understood that various embodiments of NCL logic gates are possible where the inclusion of high-Vt transistors can provide reduced power operation.

Figure 6:
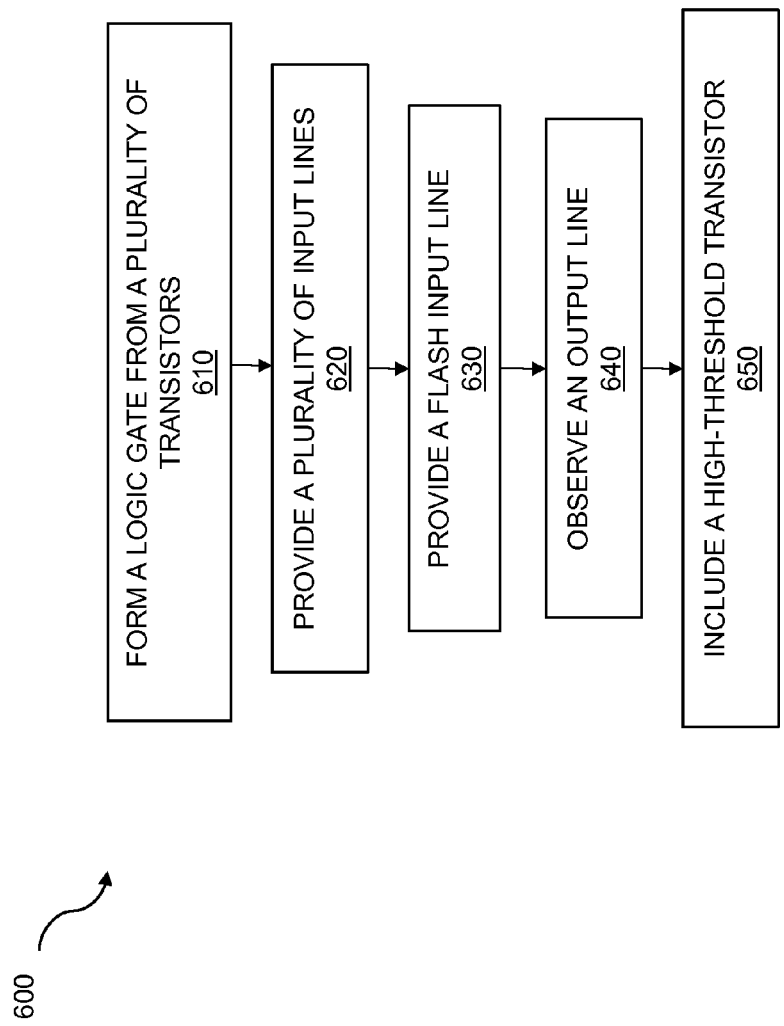
FIG. 6 is a flow diagram of a method for implementing multi-threshold NCL.

FIG. 6 is a flow diagram of a method for implementing multi-threshold NCL. The flow 600 includes forming a logic gate from a plurality of transistors 610 and providing a plurality of input lines 620, each having an asserted state and a null state, connected to the gate. The logic gate may be similar to those shown in the previous figures. The plurality of transistors may provide for logic evaluation, such as performing m-of-n threshold detection of the plurality of input lines, or any other logical evaluation. The flow 600 continues with providing a flash input line 630, having a first state and a second state, connected to the gate. The flash input line may reset the gate, causing the output of the gate to go to the null state. The flow 600 continues with observing an output line 640, having an asserted output state and a null output state, connected to the gate. The output line may be observed by other NCL gates on the same integrated circuit or different integrated circuit, or with various test equipment such as, but not limited to, an oscilloscope, wafer test equipment, in-circuit testers, or other test equipment. The flow 600 continues with including a high-threshold transistor 650 in a pull-up path that is used to reset the gate and set the output line into the null output state.

Embodiments may include a second high-threshold transistor in a pull-down path, which may be in a pull-down path for the output inverter, or in a pull-up path for the output inverter wherein the third high-threshold transistor is gated based on the flash input line to the gate. Various embodiments may include one, two, three, four, five, or more high-Vt transistor devices. Some embodiments may include a one-shot circuit where the flash input line is an input to the one-shot circuit, and the one-shot circuit resets the gate which sets the output line in the null output state. Various steps in the flow 600 may be changed in order, repeated, omitted, or the like without departing from the disclosed inventive concepts.

Various embodiments of the flow 600 may be included in a computer program product embodied in a non-transitory computer readable medium that includes code executable by one or more processors.

Figure 7:
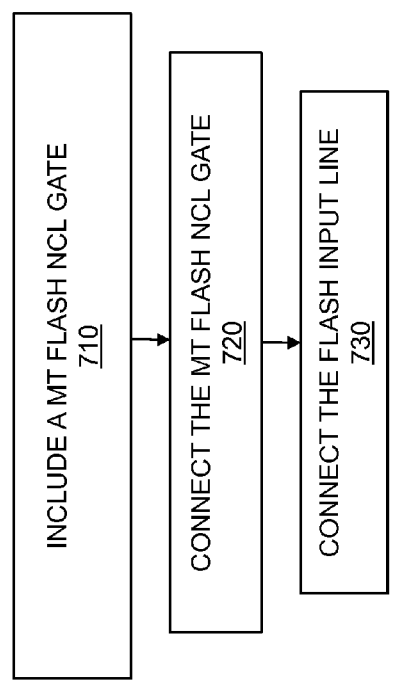
FIG. 7 is a flow diagram of a method for using multi-threshold NCL.
Figure 7:
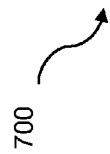

FIG. 7 is a flow diagram of a method for using multi-threshold NCL. The flow 700 comprises including a multi-threshold flash null convention logic gate 710. This flow may be implemented as part of an electronic design automation system. The multi-threshold flash NCL logic may be implemented along with other logic types. The multi-threshold flash NCL may be interspersed with other logic to accomplish the desired logic function. A mix of asynchronous and synchronous logic may be used. The flow 700 continues with connecting the multi-threshold flash null convention logic gate 720 to preceding and following logic. The flow 700 continues with connecting the flash input line 730 to a flash null generation circuit. Various steps in the flow 700 may be changed in order, repeated, omitted, or the like without departing from the disclosed inventive concepts. Various embodiments of the flow 700 may be included in a computer program product embodied in a non-transitory computer readable medium that includes code executable by one or more processors.

Figure 8:
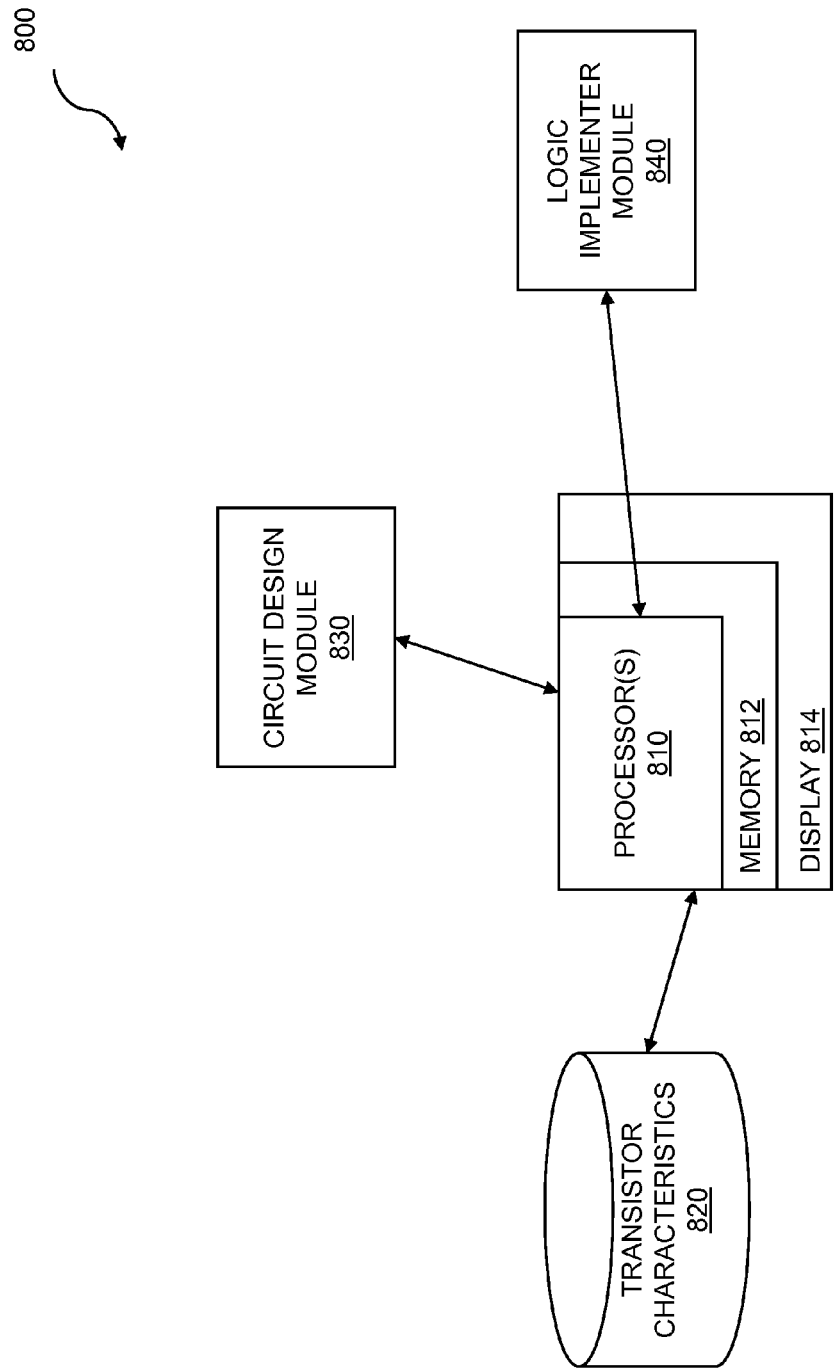
FIG. 8 is a diagram of a system for implementing multi-threshold NCL.

FIG. 8 is a diagram of a system for implementing multi-threshold NCL. A computer system 800 for logic implementation is described. The system 800 includes one or more processors 810 and a memory 812. The memory 812 may be used for storing instructions, for storing circuit designs, for storing logic designs, for system support, and the like. The one or more processors 810 may read in transistor characteristics 820 for a given technology. The transistor characteristics 820 may include information on standard and high-Vt FETs.

The one or more processors 810 may use the transistor characteristics 820 to implement multi-threshold flash NCL circuitry using a circuit design module 830. The one or more processors 810 may include a multi-threshold flash null convention logic gate to implement various logic designs using a logic implementer module 840. The logic implementer module 840 may connect the multi-threshold flash null convention logic gate to preceding and following logic. Further, the logic implementer module 840 may connect the flash input line to a flash null generation circuit. Information about the various designs may be shown on a display 814 which is attached to the one or more processors 810. The display 814 may be any electronic display, including but not limited to, a computer display, a laptop screen, a net-book screen, a tablet screen, a cell phone display, a mobile device display, a remote with a display, a television, a projector, or the like. In embodiments, the system 800 may be embodied in a client computer, a server, or a combination thereof. In at least one embodiment, a single computer may incorporate the components described above. The system 800 may include computer program product embodied in a non-transitory computer readable medium for logic implementation comprising: code for including a multi-threshold flash null convention logic gate wherein the multi-threshold flash null convention logic gate comprises: a plurality of transistors wherein the plurality of transistors provide for logical evaluation; a plurality of input lines, each having an asserted state and a null state, connected to the gate; a flash input line, having a first state and a second state, connected to the gate; an output line, having an asserted output state and a null output state, connected to the gate; and a high-threshold transistor in a pull-up path that is used to reset the gate and set the output line into the null output state; code for connecting the multi-threshold flash null convention logic gate to preceding and following logic; and code for connecting the flash input line to a flash null generation circuit.

Each of the above methods may be executed on one or more processors on one or more computer systems. Embodiments may include various forms of distributed computing, client/server computing, and cloud based computing. Further, it will be understood that for each flowchart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which implementations may be generally referred to herein as a "circuit," "module," or "system."

A programmable apparatus that executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A logic circuit comprising:
   a gate comprised of a plurality of transistors wherein the plurality of transistors provide for logical evaluation;
   a plurality of input lines, each having an asserted state and a null state, connected to the gate;
   a flash input line, having a first state and a second state, connected to the gate;
   an output line, having an asserted output state and a null output state, connected to the gate;
   a high-threshold transistor in a pull-up path of the plurality of transistors that provide for logical evaluation that is used to reset the gate and set the output line into the null output state;
   a second high-threshold transistor wherein the second high-threshold transistor is in a pull-up path for an output inverter and is gated based on the flash input line to the gate; and
   a third high-threshold transistor wherein the third high-threshold transistor is in a pulldown path of the output inverter.

2. The circuit of claim 1 wherein the plurality of transistors that provide for logical evaluation pull down a node within the gate and cause the output line to transition to the asserted output state.

3. The circuit of claim 1 wherein the high-threshold transistor in the pull-up path limits current leakage for the gate when in an off state.

4. The circuit of claim 1 further comprising a fourth high-threshold transistor wherein the fourth high-threshold transistor turns off a pull-down path of the plurality of transistors that provide for logical evaluation when the gate is being reset.

5. The circuit of claim 4 wherein the plurality of transistors that provide for logical evaluation include low-threshold transistors.

6. The circuit of claim 1 wherein the third high-threshold transistor has its gate attached to a logical evaluation node within the gate.

7. The circuit of claim 1 further comprising a one-shot circuit wherein the flash input line is an input to the one-shot circuit and wherein the one-shot circuit resets the gate which sets the output line in the null output state.

8. The circuit of claim 1 wherein the gate comprises an m-of-n threshold gate.

9. The circuit of claim 8 wherein the gate forms a null convention circuit.

10. The circuit of claim 9 wherein the gate comprises a flash type circuit.

11. A computer-implemented method for using logical evaluation comprising:
    forming a logic gate from of a plurality of transistors wherein the plurality of transistors provide for logical evaluation;
    including a plurality of input lines, each having an asserted state and a null state, connected to the gate;
    providing a flash input line, having a first state and a second state, connected to the gate;
    observing an output line, having an asserted output state and a null output state, connected to the gate;
    including a high-threshold transistor in a pull-up path of the plurality of transistors that provide for logical evaluation that is used to reset the gate and set the output line into the null output state;
    including a second high-threshold transistor wherein the second high-threshold transistor is in a pull-up path for an output inverter and is gated based on the flash input line to the gate; and including a third high-threshold transistor wherein the third high-threshold transistor is in a pulldown path of the output inverter.

12. The method of claim 11 wherein the logic gate further comprises a fourth high-threshold transistor in a pull-down path of the plurality of transistors that provide for logical evaluation.

13. The method of claim 12 wherein the fourth high-threshold transistor in the pull-down path for the plurality of transistors that provide for logical evaluation turns off the pull-down path when the gate is being reset.

14. The method of claim 11 wherein the logic gate further comprises a one-shot circuit wherein the flash input line is an input to the one-shot circuit and wherein the one-shot circuit resets the gate which sets the output line in the null output state.

15. An m-of-n flash-type threshold gate comprising:
   a plurality of transistors wherein the plurality of transistors provide for logical evaluation;
   a plurality of n input lines, each having an asserted state and a null state, connected to the gate;
   a flash input line, having a first state and a second state, connected to the gate;
   an output line, having an asserted output state and a null output state, connected to the gate wherein the output line transitions to the asserted output state when m of the n input lines are in their respective asserted states;
   a high-threshold transistor in a pull-up path of the plurality of transistors that provide for logical evaluation that is used to reset the gate and set the output line into the null output state;
   a second high-threshold transistor wherein the second high-threshold transistor is in a pull-up path for an output inverter, coupled to the output line, and is gated based on the flash input line to the gate; and
   a third high-threshold transistor wherein the third high-threshold transistor is in a pulldown path of the output inverter.

16. The gate of claim 15 further comprising a fourth high-threshold transistor wherein the fourth high-threshold transistor turns off a pull-down path when the gate is being reset.

17. The gate of claim 16 wherein the plurality of transistors that provide for logical evaluation are part of the pull-down path.

* * * * *